(12) United States Patent
Chen

(10) Patent No.: US 6,675,319 B2
(45) Date of Patent: Jan. 6, 2004

(54) MEMORY ACCESS AND DATA CONTROL

(76) Inventor: Han-ping Chen, P.O. Box 2871, Saratoga, CA (US) 95070

( * ) Notice: Subject to any disclaimer, the term of this patent is extended or adjusted under 35 U.S.C. 154(b) by 576 days.

(21) Appl. No.: 09/747,986

(22) Filed: Dec. 27, 2000

(65) Prior Publication Data

US 2002/0083363 A1 Jun. 27, 2002

(51) Int. Cl.[7] .................................................. G06F 11/00
(52) U.S. Cl. ........................................... 714/8; 711/133
(58) Field of Search ............................... 714/8, 7, 6, 13, 714/27, 31, 42, 48, 54; 711/133, 162

(56) References Cited

U.S. PATENT DOCUMENTS

| | | | | |
|---|---|---|---|---|
| 5,255,227 A | * | 10/1993 | Haeffele | 365/200 |
| 5,353,253 A | * | 10/1994 | Nakajima | 365/200 |
| 5,548,554 A | * | 8/1996 | Pascucci et al. | 365/200 |
| 5,991,902 A | * | 11/1999 | Yoshida | 714/710 |
| 6,125,421 A | * | 9/2000 | Roy | 711/5 |
| 6,373,757 B1 | * | 4/2002 | Bishop | 365/200 |
| 6,567,290 B2 | * | 5/2003 | Alexanian | 365/63 |

* cited by examiner

Primary Examiner—Nadeem Iqbal

(57) ABSTRACT

A method and apparatus controls the memory data access of memory devices in order to utilize partially defective memory devices to construct usable memory chip or module assemblies that meet the specification of a fully or partially functional assembly.

20 Claims, 10 Drawing Sheets

US 6,675,319 B2

MEMORY ACCESS AND DATA CONTROL

BACKGROUND OF THE INVENTION

This invention relates to semiconductor memory devices, memory chips, memory modules, and the handling of defective memory components.

Due to the yield limitation of semiconductor fabrication process, a semiconductor memory wafer usually contains defective memory devices. As the cell density of the semiconductor device increases, it is becoming harder to achieve high production yield.

During the device fabrication process, certain repairing process may be used to replace defective rows or columns in the memory cell array. However, there is a limit as to the capability of such repairing process. Certain memory devices remain defective at the semiconductor die level after the fabrication process.

To repair the memory devices above the die level is a complex issue regarding feasibility, efficiency, and performance.

BRIEF SUMMARY OF THE INVENTION

This invention proposes a method and apparatus to efficiently utilize partially defective memory devices to construct usable memory chip or module packages that meet the specification of a functional package.

This invention provides a method that maximizes the usage of non-defective memory data bits in the partially defective memory devices.

The present invention provides a method that simplifies the production and process of memory chips or modules.

This invention further provides a method to minimize or eliminate the initialization of the chips or modules.

DETAILED DESCRIPTION OF THE INVENTION

The present invention will be illustrated with some preferred embodiments.

Figure 1:
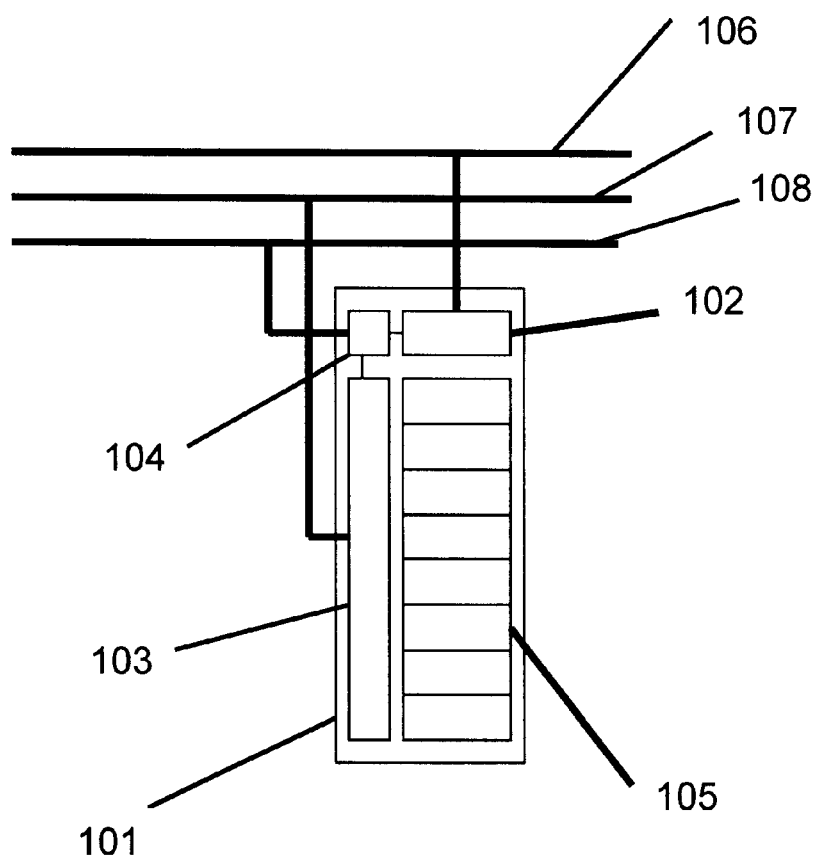
FIG. 1 is a diagram of a prior art memory chip.

FIG. 1 is a diagram of a prior art memory chip. The memory device 101 contains device data port 102, a memory address unit 103, and a memory control unit 104, and a memory cell array 105. The device data port 102 is connected to the chip data bus 106. The device address unit 103 is connected to the chip address bus 107. The device control unit 104 is connected to the chip control bus 108.

Figure 2:
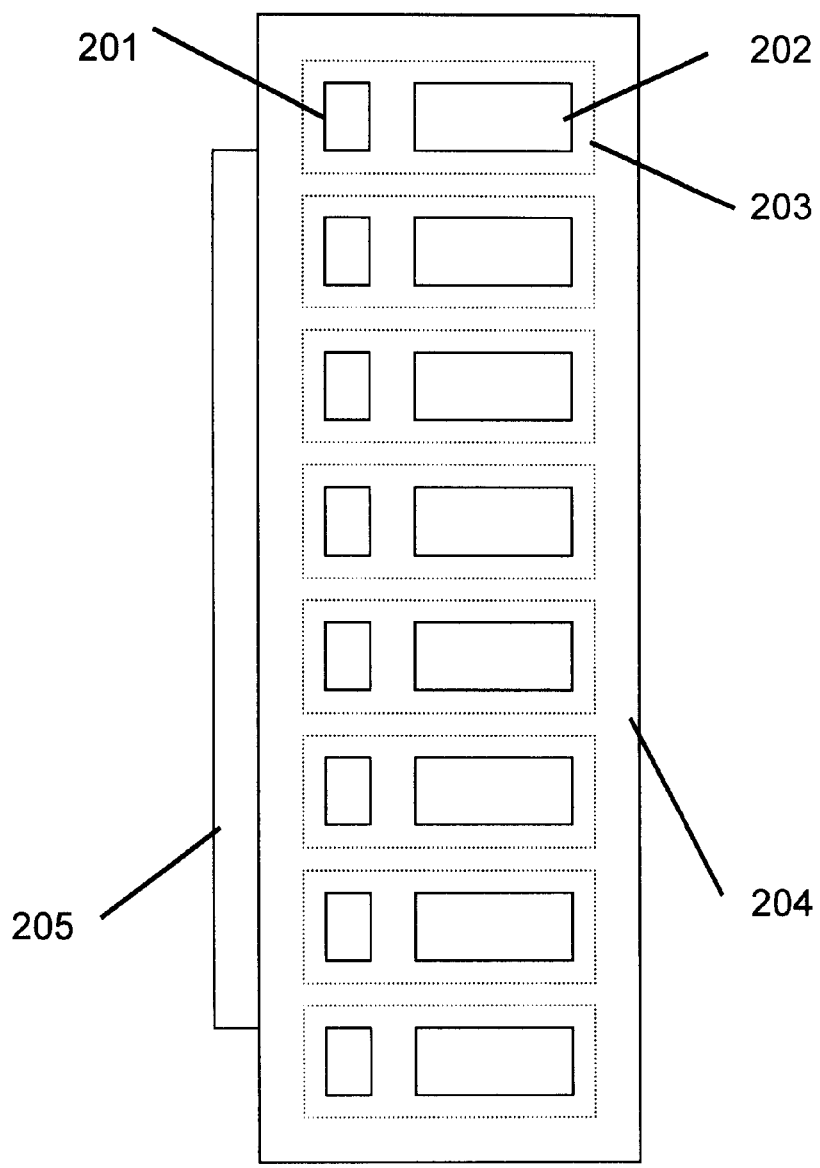
FIG. 2 is a diagram of a prior art memory module.

FIG. 2 is a diagram of a prior art memory module. The memory module data ports 201 are connected to the corresponding chip data ports of the memory chip 202. This combination constitutes a memory unit 203. This memory module contains a total of eight memory units. The module is built on a printed circuit board 204 with an edge connection 205 to interface with other system components.

Figure 3:
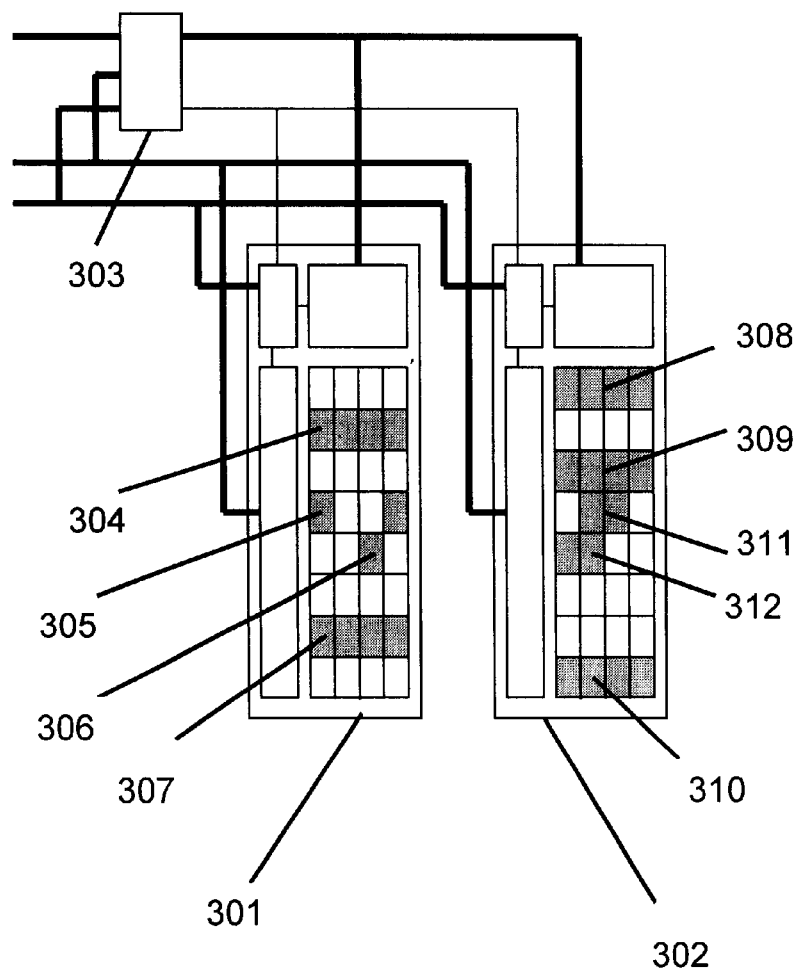
FIG. 3 shows a preferred embodiment of the present invention for a memory chip package.

FIG. 3 shows a preferred embodiment of the present invention for a memory chip package. The memory access controller 303 controls the data input and output of the two memory devices 301 and 302.

In memory device 301, the memory cell array is divided into eight memory blocks. Each memory block contains four memory data segments. Assuming a memory data width of eight, each data segment contains two data bits.

Memory device 301 contains defective memory cells within memory blocks 304, 305, 306, and 307. Memory device 302 contains defective memory cells within memory blocks 308, 309, 310, 311, and 312. For defective memory blocks 304 and 307 in memory device 301, the corresponding memory blocks in m memory device 302 are fully functional. For defective memory blocks 305 and 306 in memory device 301, the corresponding memory blocks in memory device 302 are blocks 311, and 312. Although memory blocks 311, and 312 are not fully functional, for the defective data segments in blocks 305 and 306, the corresponding data segments in blocks 311, and 312 are functional.

Figure 4:
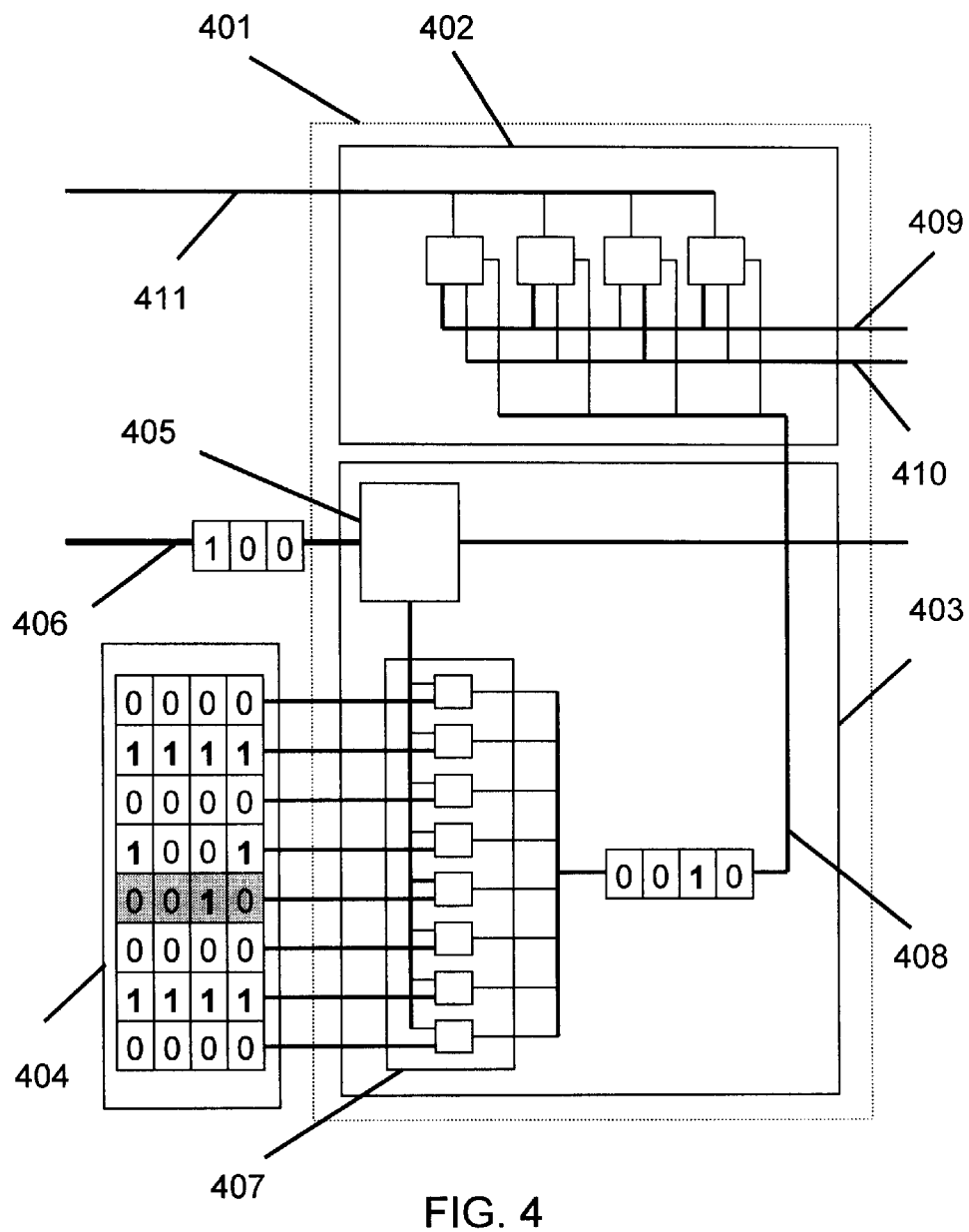
FIG. 4 shows a preferred embodiment of the present invention for a memory access controller.

FIG. 4 shows a preferred embodiment of a memory access controller for the memory chip package in FIG. 3. The memory access controller 401 consists of a data routing unit 402 and a data control unit 403.

The data control unit 403 receives the status of the memory blocks and data segments from the memory status unit 404. The memory status unit 404 contains a table with eight entries, one for each memory block in memory device 301. Each table entry contains four status bits, one for each data segment within the corresponding memory block. The status bit value is a 0 if the corresponding data segment is functional. The value is a 1 if the corresponding data segment is defective.

Upon control signals, a decoder logic block 405 decodes three block address lines 406 into eight block selection lines. The decoded block selection line selects the memory status entry in selection logic unit 407 and sends the selected entry 408 to the memory data routing unit 402.

The memory data routing unit 402 routes the selected memory data bits to the memory data bus for memory read and write operations. The memory data routing unit 402 consists of four data multiplexing elements. Each multiplexing element controls a 2-bit data segment.

Assuming a memory block address of 4, which corresponds to memory block 306 in FIG. 3, the selected status entry is binary 0010. For data segments 0, 1, and 3, the control bits are 0. The corresponding data segments on the memory data bus 411 are connected to the data segments on the memory data lines 409 for memory device 301. For data segments 2, the control bit is a 1. The corresponding data segment on the memory data bus is connected to the data segment on the memory data lines 410 for memory device 302.

Figure 5:
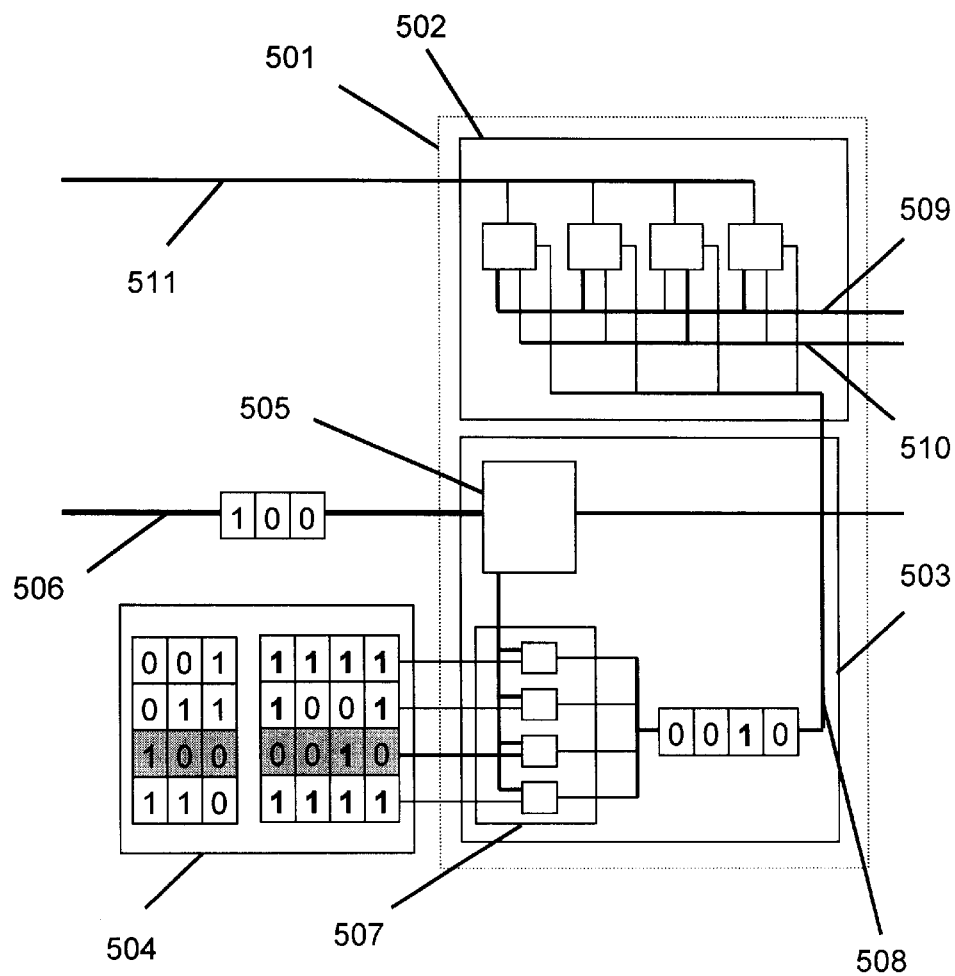
FIG. 5 shows another preferred embodiment of the present invention for a memory access controller.

FIG. 5 shows another preferred embodiment of a memory access controller for the memory chip package in FIG. 3. The memory access controller 501 consists of a data routing unit 502 and a data control unit 503.

In this embodiment, the memory status unit 504 is constructed in a different fashion. It contains an entry for each defective memory block in FIG. 3. Beside the memory data status bits, each status entry also contains the block address of the defective block. For example, there is an entry with a block address 4 and status bits 0010 binary.

Upon control signals, the block address unit 505 routes the block address lines 506 to the selection logic unit 507. The selection logic unit 507 compares the address lines with the defective block addresses in the status table and sends the selected entry 508 to the memory data routing unit 502.

The memory data routing unit 502 routes the selected memory data bits to the memory data bus for memory read and write operations. The memory data routing unit 502 consists of four data multiplexing elements. Each data routing element controls a 2-bit data segment.

Figure 6:
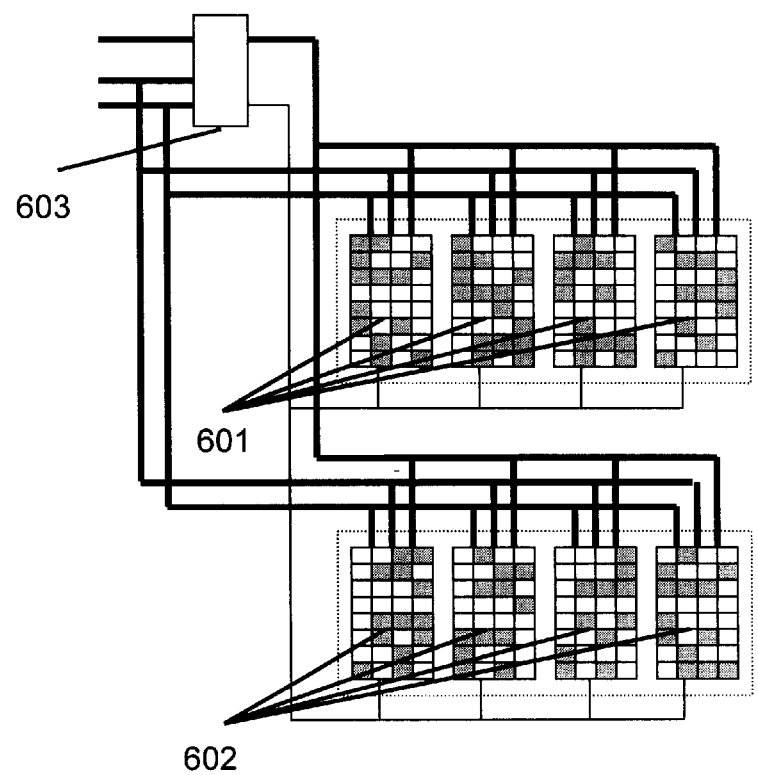
FIG. 6 shows a preferred embodiment of the present invention for a memory module package.

FIG. 6 shows a preferred embodiment of the present invention for a memory module package. The first group of memory chips contains four memory units 601. The second group of memory chips contains four other memory units 602. The memory access controller 603 controls the data routing of these two memory groups.

Figure 7:
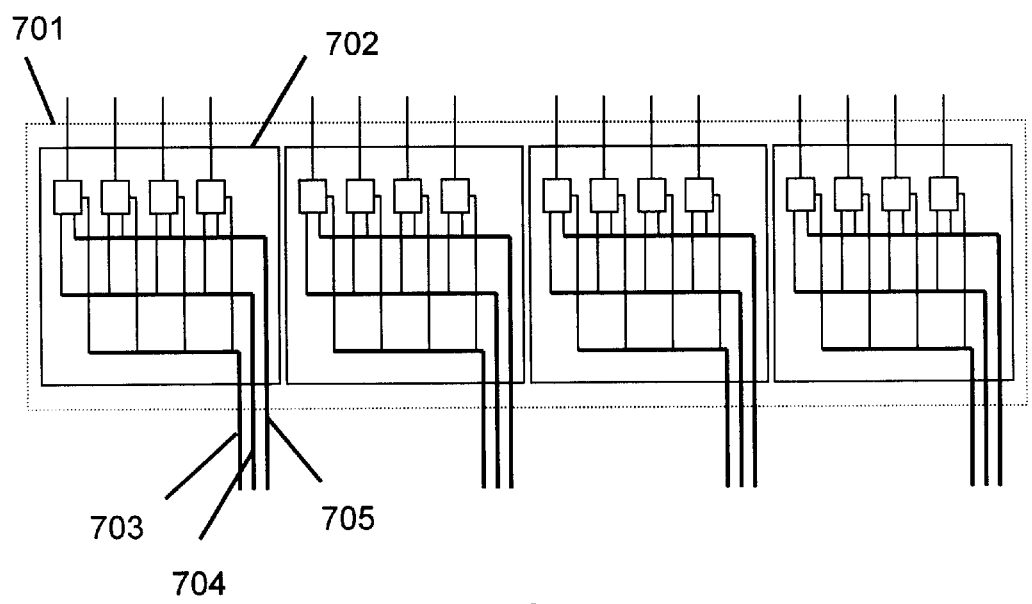
FIG. 7 shows a preferred embodiment of the present invention for a data selector in a memory access controller for FIG. 6.

FIG. 7 shows a preferred embodiment of the present invention for a data selector in a memory access controller for FIG. 6. The memory data routing unit 701 consists of 16 data multiplexing elements. Each multiplexing element controls a 2-bit data segment within a memory chip. These multiplexing elements are grouped into 4 multiplexing element units 702, one for each 8-bit memory byte. In this preferred embodiment, a data multiplexing element consists of two 2-to-1 data multiplexing components.

For a control bit of 1 on the control line 703, the corresponding data segment on the memory data bus is connected to the data segments on the memory data lines 704 for memory device 601. For a control bit of 1, the corresponding data segment on the memory data bus is connected to the data segment on the memory data lines 705 for memory device 602.

As an example, assume that there are thirty-two data bits D0 to D31. Data multiplexing unit number 0 supports data bits D0 to D7. Data multiplexing unit number 1 supports data bits D8 to D15. Data multiplexing unit number 2 supports data bits D16 to D23. Data multiplexing unit number 3 supports data bits D24 to D31.

Figure 8:
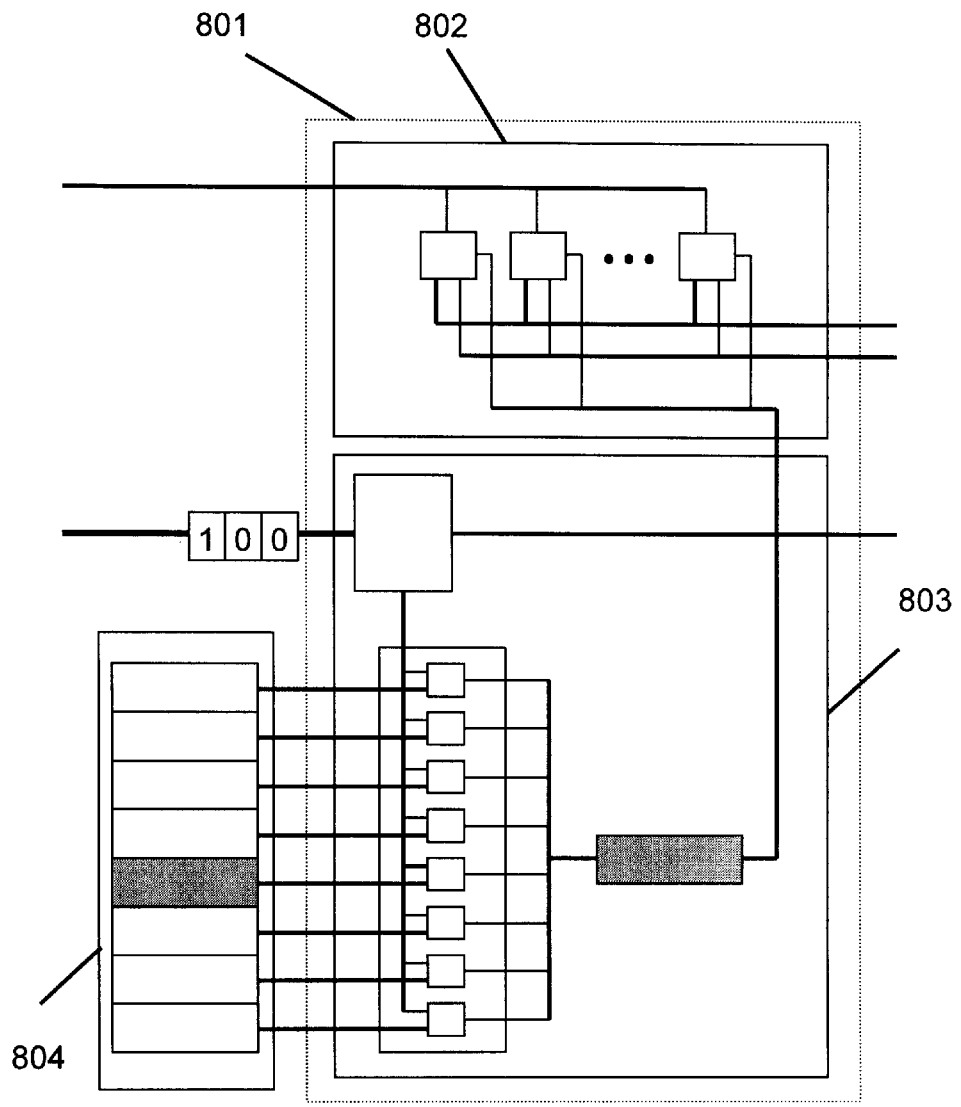
FIG. 8 shows a preferred embodiment of the present invention for a memory access controller for FIG. 6.

FIG. 8 shows a preferred embodiment of a memory access controller for the memory chip package in FIG. 6. The memory access controller 801 consists of a data routing unit 802 and a data control unit 803.

The data control unit 803 receives the status of the memory blocks and data segments from the memory status unit 804. The memory status unit 804 contains a table with eight entries, one for each memory block in memory group 601. Each table entry now contains 16 status bits, 4 for each memory chip and 1 for each data segment within the memory chips.

For the same reason, the memory data routing unit 802 consists of 16 data multiplexing elements as illustrated in FIG. 7.

Figure 9:
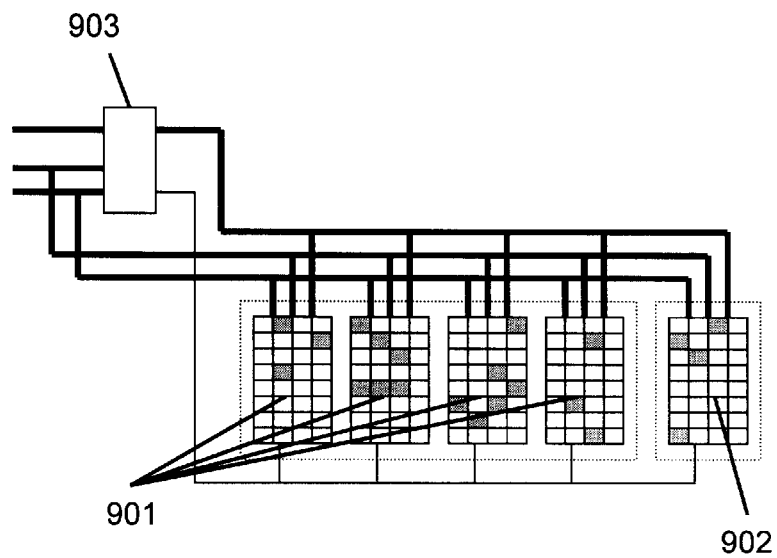
FIG. 9 shows another preferred embodiment of the present invention for a memory module package.

FIG. 9 shows another preferred embodiment of the present invention for a memory module package. The first group of memory chips contains four memory units 901. The second group of memory chips contains one memory unit 902. The memory access controller 903 controls the data routing of these two memory groups.

Figure 10:
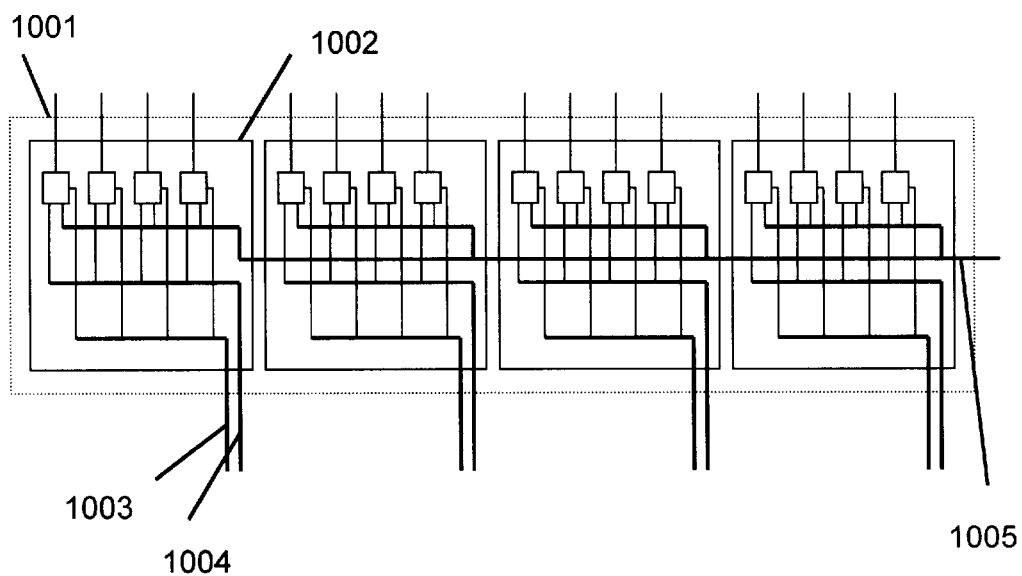
FIG. 10 shows a preferred embodiment of the present invention for a data selector in a memory access controller for FIG. 9.

FIG. 10 shows a preferred embodiment of the present invention for a data selector in a memory access controller for FIG. 9. The memory data routing unit 1001 consists of 16 data multiplexing elements. Each multiplexing element controls a 2-bit data segment within a memory chip. These multiplexing elements are grouped into 4 multiplexing element units 1002, one for each 8-bit memory byte. In this preferred embodiment, a data multiplexing element consists of two 2-to-1 data multiplexing components.

For a control bit of 1 on the control lines 1003, the corresponding data segment on the memory data bus is connected to the data segments on the memory data lines 1004 for memory group 901. For a control bit of 1, the corresponding data segment on the memory data bus is connected to the data segment on the memory data lines 1005 for memory group 902.

For FIG. 9 and FIG. 10, the memory data lines 1005 are from the same chip in memory group 902. It differs from FIG. 6 and FIG. 7 where the memory data lines 705 are from four different chips in memory group 602.

In this preferred embodiment, a functional data segment in 902 can only replace a defective data segment at the corresponding chip location in memory group 901.

Figure 11:
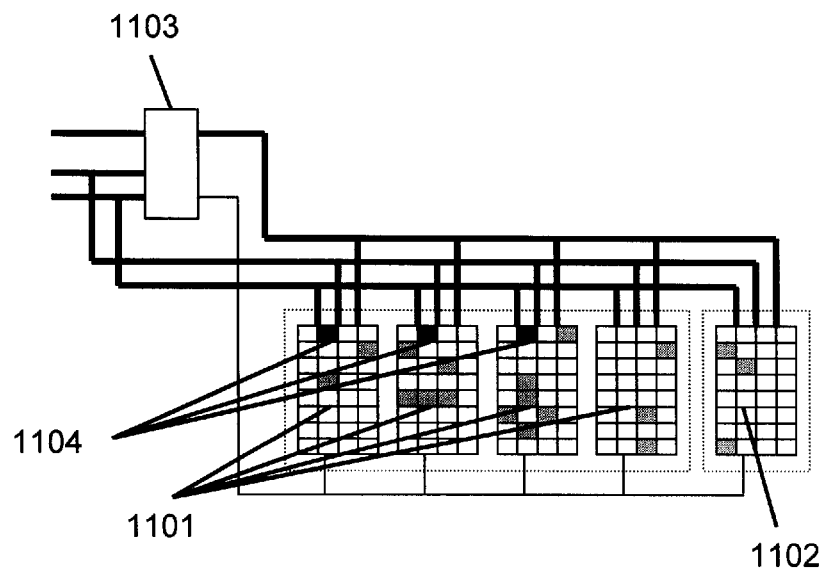
FIG. 11 shows a different preferred embodiment of the present invention for a memory module package.

FIG. 11 shows another preferred embodiment of the present invention for a memory module package. The first group of memory chips contains four memory units 1101. The second group of memory chips contains one memory unit 1102. The memory access controller 1103 controls the data routing of these two memory groups.

In this preferred embodiment, three defective data segments 1104 are at the same chip location, a situation that is not curable with a data selector in FIG. 10.

Figure 12:
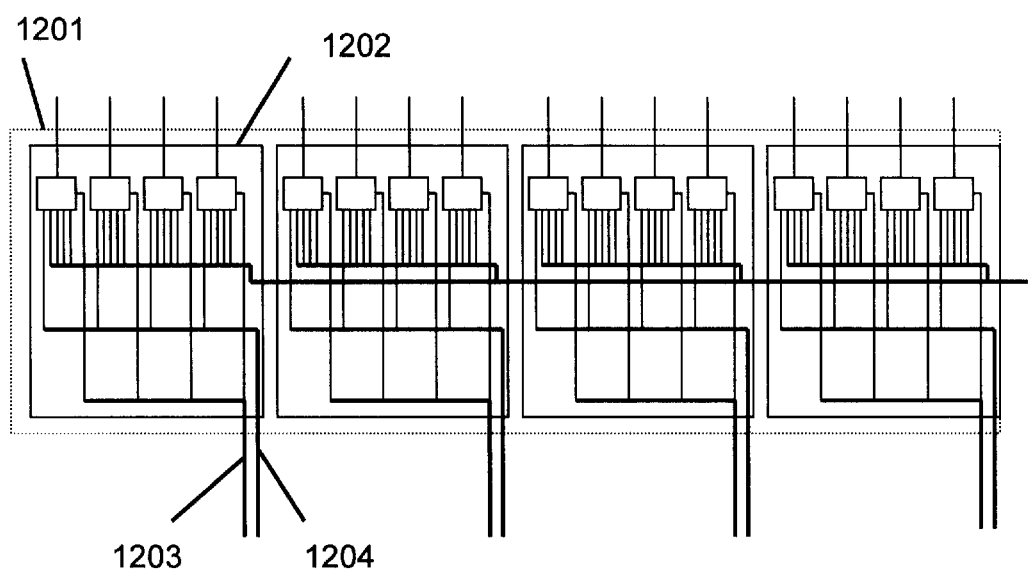
FIG. 12 shows a preferred embodiment of the present invention for a data selector in a memory access controller for FIG. 11.

FIG. 12 shows a preferred embodiment of the present invention for a data selector in a memory access controller for FIG. 11. The memory data routing unit 1201 consists of 16 data multiplexing elements. Each multiplexing element controls a 2-bit data segment within a memory chip. These multiplexing elements are grouped into 4 multiplexing element units 1202, one for each 8-bit memory byte. In this preferred embodiment, a data multiplexing element consists of two 5-to-1 data multiplexing components.

For each data segment on the memory data bus, the control signal on the control lines 1203 selects either the corresponding data segment from memory group 1101 or any of the 4 data segments in memory group 1102. This arrangement can repair any 4 defective data segments at one memory block location.

Figure 13:
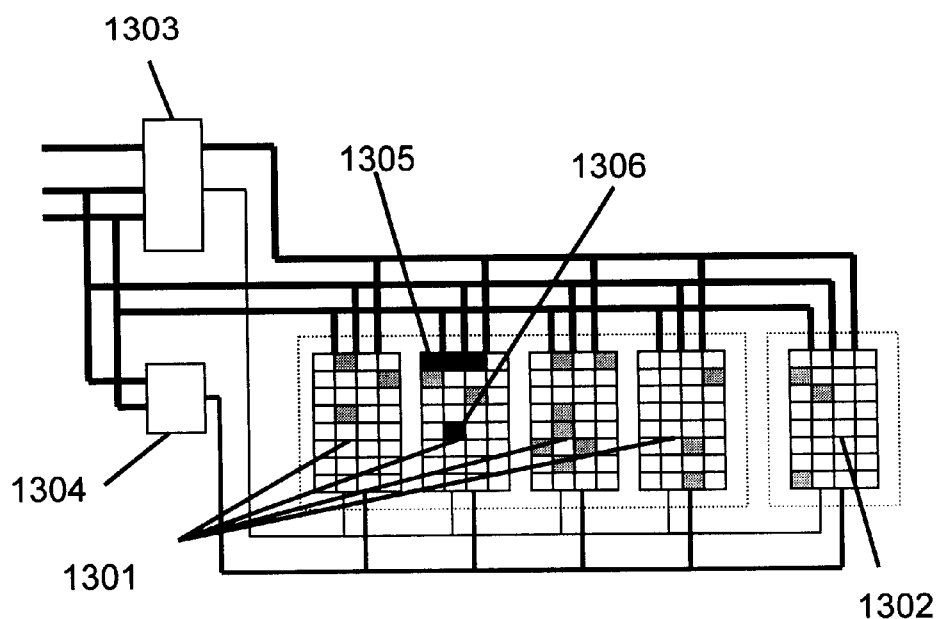
FIG. 13 shows a still another preferred embodiment of the present invention for a memory module package.

FIG. 13 shows another preferred embodiment of the present invention for a memory module package. The first group of memory chips contains four memory units 1301. The second group of memory chips contains one memory unit 1302. The memory access controller 1303 controls the data routing of these two memory groups.

In this preferred embodiment, there is an address-mapping unit 1304 that converts the memory block address on the memory address bus to memory block addresses to the memory units.

As illustrated, memory block number 0 originally contains more than 4 defective data segments. After an address mapping to exchange the memory block 1305 and memory block 1306 in the third unit for D16 to D23 in memory group 1301, the new memory block number 0 contains only 4 defective data segments. At the same time, memory block number 4 also contains just 4 defective data segments.

In fact, the memory structure of FIG. 13 after the address mapping is the same as the memory structure shown in FIG. 11.

Figure 14:
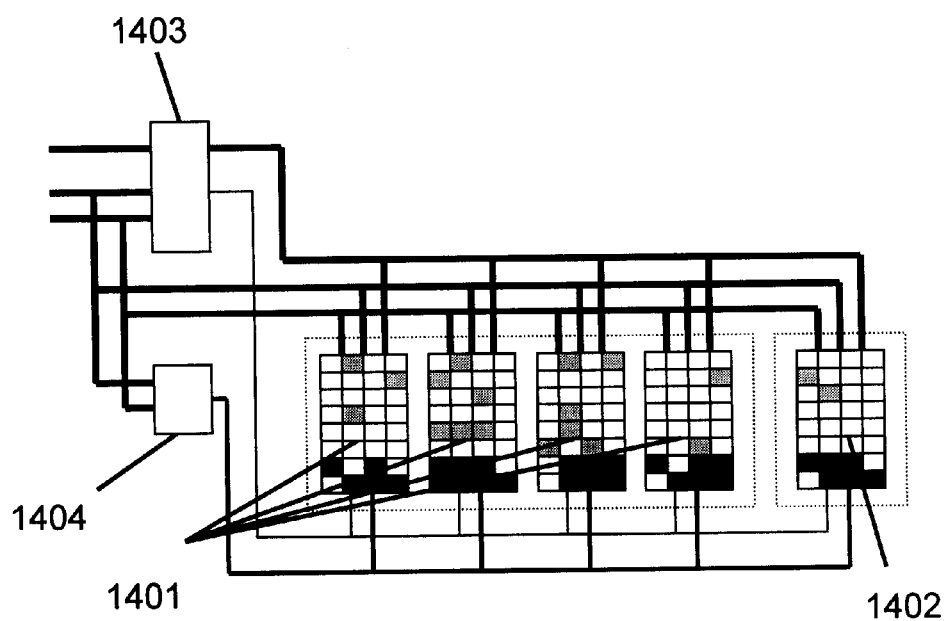
FIG. 14 shows another different preferred embodiment of the present invention for a memory module package.

FIG. 14 shows another different preferred embodiment of the present invention for a memory module package. The memory access controller 1403 controls the data routing of the memory groups 1401 and 1402. The address-mapping unit 1404 converts the memory block address on the memory address bus to memory block addresses to the memory units.

The memory address-mapping unit 1404 reassigns the address space for the memory units in order to place them in the appropriate memory regions. First, the number of defective data segments is kept within the 4-segment limit whenever possible. Second, any memory blocks that cannot be kept within the 4-segment limit are mapped to the high address regions such that the memory module can be used in a degraded manner. In this preferred embodiment, six of the eight memory regions remain functional after the mapping.

I claim:

1. A memory chip, module, or subsystem assembly comprising:
    (a) a plurality of assembly memory bus lines for address, data, and control signals;
    (b) a first group of at least one primary memory sub-assemblies, each having a plurality of sub-assembly memory bus lines and a plurality of sub-assembly memory cells partitioned into a plurality of sub-assembly memory blocks each containing at least one memory cells;
    (c) a second group of at least one supporting memory sub-assemblies, each having a plurality of sub-assembly memory bus lines and a plurality of sub-assembly memory cells partitioned into a plurality of sub-assembly memory blocks each containing at least one memory cells;
    (d) a memory status unit containing a set of fixed or variable settings, which is a set of metal contacts, jumpers, resistors, logic bits, programmable storage cells controlled by internal or external control signals, or a combination of the above items;
    (e) a memory access control unit which includes a data routing unit;
    wherein the primary memory sub-assemblies contain at least one sub-assembly that has one or more defective memory cells;
    wherein the supporting memory sub-assemblies also contain at least one sub-assembly that has one or more defective memory cells;
    wherein, for at least one memory access to a memory address, the memory access control unit assigns at least a first assembly data bit to a first sub-assembly data bit in the first group of memory sub-assemblies and at least a second assembly data bit to a second sub-assembly data bit in the second group of memory sub-assemblies, at the appropriate memory timing cycles, according to the memory access address;
    wherein the memory status unit contains information for the memory access control unit to determine the data bit assignments.

2. The memory assembly of claim 1, wherein the assembly is a memory subsystem and the sub-assembly is a memory module.

3. The memory assembly of claim 1, wherein the assembly is a memory module and the sub-assembly is a memory chip.

4. The memory assembly of claim 1, wherein the assembly is a memory chip and the sub-assembly is a memory device.

5. A memory chip, module, or subsystem assembly comprising:
    (a) a plurality of assembly memory bus lines for address, data, and control signals;
    (b) a first group of at least one primary memory sub-assemblies, each having a plurality of sub-assembly memory bus lines and a plurality of sub-assembly memory cells partitioned into a plurality of sub-assembly memory blocks each containing at least one memory cells;
    (c) a second group of at least one supporting memory sub-assemblies, each having a plurality of sub-assembly memory bus lines and a plurality of sub-assembly memory cells partitioned into a plurality of sub-assembly memory blocks each containing at least one memory cells;
    (d) a memory status unit containing a set of fixed or variable settings, which is a set of metal contacts, jumpers, resistors, logic bits, programmable storage cells controlled by internal or external control signals, or a combination of the above items;
    (e) a memory access control unit which includes a data routing unit;
    wherein the primary memory sub-assemblies contain at least one sub-assembly that has one or more defective memory cells;
    wherein, for at least one memory access to a memory address, the memory access control unit assigns at least a first assembly data bit to a first sub-assembly data bit in the first group of memory sub-assemblies and at least a second assembly data bit to a second sub-assembly data bit in the second group of memory sub-assemblies, at the appropriate memory timing cycles, according to the memory access address;
    wherein the memory status unit contains information for the memory access control unit to determine the data bit assignments.

6. The memory assembly of claim 5, wherein the assembly is a memory subsystem and the sub-assembly is a memory module.

7. The memory assembly of claim 5, wherein the assembly is a memory module and the sub-assembly is a memory chip.

8. The memory assembly of claim 5, wherein the assembly is a memory chip and the sub-assembly is a memory device.

9. A memory chip, module, or subsystem assembly comprising:
    (a) a plurality of assembly memory bus lines for address, data, and control signals;

(b) a first group of at least one primary memory sub-assemblies, each having a plurality of sub-assembly memory bus lines and a plurality of sub-assembly memory cells partitioned into a plurality of sub-assembly memory blocks each containing at least one memory cells;

(c) a second group of at least one supporting memory sub-assemblies, each having a plurality of sub-assembly memory bus lines and a plurality of sub-assembly memory cells partitioned into a plurality of sub-assembly memory blocks each containing at least one memory cells;

(d) a memory status unit containing a set of fixed or variable settings, which is a set of metal contacts, jumpers, resistors, logic bits, programmable storage cells controlled by internal or external control signals, or a combination of the above items;

(e) a memory access control unit which includes a data routing unit;

(f) a memory address mapping unit;

wherein the primary memory sub-assemblies contain at least one sub-assembly that has one or more defective memory cells;

wherein the supporting memory sub-assemblies also contain at least one sub-assembly that has one or more defective memory cells;

wherein the memory address mapping unit reassigns the memory address for at least one of the memory units in the first group or the second group of memory sub-assemblies;

wherein, for at least one memory access to a memory address, the memory access control unit assigns at least a first assembly data bit to a first sub-assembly data bit in the first group of memory sub-assemblies and at least a second assembly data bit to a second sub-assembly data bit in the second group of memory sub-assemblies, at the appropriate memory timing cycles, according to the memory access address;

wherein the memory status unit contains information for the memory access control unit to determine the data bit assignments.

10. The memory assembly of claim 9, wherein the assembly is a memory subsystem and the sub-assembly is a memory module.

11. The memory assembly of claim 9, wherein the assembly is a memory module and the sub-assembly is a memory chip.

12. The memory assembly of claim 9, wherein the assembly is a memory chip and the sub-assembly is a memory device.

13. A memory chip, module, or subsystem assembly comprising:

(a) a plurality of assembly memory bus lines for address, data, and control signals;

(b) a first group of at least one primary memory sub-assemblies, each having a plurality of sub-assembly memory bus lines and a plurality of sub-assembly memory cells partitioned into a plurality of sub-assembly memory blocks each containing at least one memory cells;

(c) a second group of at least one supporting memory sub-assemblies, each having a plurality of sub-assembly memory bus lines and a plurality of sub-assembly memory cells partitioned into a plurality of sub-assembly memory blocks each containing at least one memory cells;

(d) a memory status unit containing a set of fixed or variable settings, which is a set of metal contacts, jumpers, resistors, logic bits, programmable storage cells controlled by internal or external control signals, or a combination of the above items;

(e) a memory access control unit which includes a data routing unit;

(f) a memory address mapping unit;

wherein the primary memory sub-assemblies contain at least one sub-assembly that has one or more defective memory cells;

wherein the memory address mapping unit reassigns the memory address for at least one of the memory units in the first group or the second group of memory sub-assemblies;

wherein, for at least one memory access to a memory address, the memory access control unit assigns at least a first assembly data bit to a first sub-assembly data bit in the first group of memory sub-assemblies and at least a second assembly data bit to a second sub-assembly data bit in the second group of memory sub-assemblies, at the appropriate memory timing cycles, according to the memory access address;

wherein the memory status unit contains information for the memory access control unit to determine the data bit assignments.

14. The memory assembly of claim 13, wherein the assembly is a memory subsystem and the sub-assembly is a memory module.

15. The memory assembly of claim 13, wherein the assembly is a memory module and the sub-assembly is a memory chip.

16. The memory assembly of claim 13, wherein the assembly is a memory chip and the sub-assembly is a memory device.

17. A memory device comprising:

(a) a plurality of device assembly bus lines for address, data, and control signals;

(b) a first group of at least one primary memory sub-assemblies, each having a plurality of sub-assembly data and control lines and a plurality of sub-assembly memory cells partitioned into a plurality of sub-assembly memory blocks each containing at least one memory cells;

(c) a second group of at least one supporting memory sub-assemblies, each having a plurality of sub-assembly memory data and control lines and a plurality of sub-assembly memory cells partitioned into a plurality of sub-assembly memory blocks each containing at least one memory cells;

(d) a memory access control unit which includes a data routing unit;

wherein the primary memory sub-assemblies contain at least one sub-assembly that has one or more defective memory cells;

wherein, for at least one memory access to a memory address, the memory access control unit assigns at least a first assembly data bit to a first sub-assembly data bit in the first group of memory sub-assemblies and at least a second assembly data bit to a second sub-assembly data bit in the second group of memory sub-assemblies, at the appropriate memory timing cycles, according to the memory access address.

18. The memory package of claim 17, further comprises a set of fixed or variable settings, which is a set of metal contacts, jumpers, resistors, or logic bits, for the memory access control unit to determine data bit assignments.

19. A memory device comprising:
   (a) a plurality of device assembly bus lines for address, data, and control signals;
   (b) a first group of at least one primary memory sub-assemblies, each having a plurality of sub-assembly data and control lines and a plurality of sub-assembly memory cells partitioned into a plurality of sub-assembly memory blocks each containing at least one memory cells;
   (c) a second group of at least one supporting memory sub-assemblies, each having a plurality of sub-assembly memory data and control lines and a plurality of sub-assembly memory cells partitioned into a plurality of sub-assembly memory blocks each containing at least one memory cells;
   (d) a memory access control unit which includes a data routing unit;
   (e) a memory address mapping unit;
   wherein the primary memory sub-assemblies contain at least one sub-assembly that has one or more defective memory cells;
   wherein the memory address mapping unit reassigns the memory address for at least one of the memory units in the first group or the second group of memory sub-assemblies;
   wherein, for at least one memory access to a memory address, the memory access control unit assigns at least a first assembly data bit to a first sub-assembly data bit in the first group of memory sub-assemblies and at least a second assembly data bit to a second sub-assembly data bit in the second group of memory sub-assemblies, at the appropriate memory timing cycles, according to the memory access address.

20. The memory package of claim 19, further comprises a set of fixed or variable settings, which is a set of metal contacts, jumpers, resistors, or logic bits, for the memory access control unit to determine the data bit assignments.

* * * * *